United States Patent
Classen et al.

(10) Patent No.: US 12,210,033 B2
(45) Date of Patent: Jan. 28, 2025

(54) MICROMECHANICAL COMPONENT, IN PARTICULAR, INERTIAL SENSOR, INCLUDING A SEISMIC MASS, A SUBSTRATE, AND A CAP

(71) Applicant: Robert Bosch GmbH, Stuttgart (DE)

(72) Inventors: Johannes Classen, Reutlingen (DE); Michael Saettler, Kusterdingen (DE)

(73) Assignee: ROBERT BOSCH GMBH, Stuttgart (DE)

( * ) Notice: Subject to any disclaimer, the term of this patent is extended or adjusted under 35 U.S.C. 154(b) by 0 days.

(21) Appl. No.: 17/769,075

(22) PCT Filed: Sep. 25, 2020

(86) PCT No.: PCT/EP2020/076915
§ 371 (c)(1),
(2) Date: Apr. 14, 2022

(87) PCT Pub. No.: WO2021/083589
PCT Pub. Date: May 6, 2021

(65) Prior Publication Data
US 2024/0103035 A1     Mar. 28, 2024

(30) Foreign Application Priority Data
Oct. 28, 2019    (DE) ...................... 10 2019 216 530.3

(51) Int. Cl.
*G01P 15/125*    (2006.01)
*G01P 15/08*    (2006.01)

(52) U.S. Cl.
CPC .... *G01P 15/125* (2013.01); *G01P 2015/0871* (2013.01)

(58) Field of Classification Search
CPC .............................................. G01P 2015/0871
(Continued)

(56) References Cited

U.S. PATENT DOCUMENTS

2012/0216616 A1    8/2012    Schultz
2013/0299923 A1*   11/2013   Classen ................. B81B 3/0018
                                                    257/415
(Continued)

FOREIGN PATENT DOCUMENTS

CN    102016603 A    4/2011
CN    102030302 A    8/2015
(Continued)

OTHER PUBLICATIONS

International Search Report for PCT/EP2020/076915, Issued Dec. 14, 2020.

*Primary Examiner* — Walter L Lindsay, Jr.
*Assistant Examiner* — Philip T Fadul
(74) *Attorney, Agent, or Firm* — NORTON ROSE FULBRIGHT US LLP; Gerard A. Messina (57) ABSTRACT

A micromechanical component, in particular, an inertial sensor, including a seismic mass, a substrate, and a cap. The component includes a reference electrode, which is in a first electrode layer and is connected to the substrate, and a further reference electrode, which is in a second electrode layer and is connected to the cap. The seismic mass is deflectable on two sides, in a direction perpendicular to the major plane of extension of the reference electrode. The seismic mass includes a flexible limit stop in the direction of deflection towards the first electrode layer. The flexible limit stop is connected to the main part of the seismic mass using a spring element. The spring element is in an elastic layer, which is positioned between a layer of the main part of the seismic mass and the first electrode layer.

8 Claims, 5 Drawing Sheets

(58) Field of Classification Search
USPC .................................................. 73/514.32
See application file for complete search history.

(56) References Cited

U.S. PATENT DOCUMENTS

2015/0033849 A1* 2/2015 Hanson ................ G01C 19/574
                                                    73/504.12
2015/0241216 A1   8/2015 Ahtee et al.

FOREIGN PATENT DOCUMENTS

| DE | 102008043753 A1 | 5/2010 |
| DE | 102009000407 A1 | 7/2010 |
| DE | 102012207939 A1 | 11/2013 |
| EP | 0244581 A1 | 11/1987 |
| EP | 0773443 B1 | 5/2000 |

* cited by examiner

MICROMECHANICAL COMPONENT, IN PARTICULAR, INERTIAL SENSOR, INCLUDING A SEISMIC MASS, A SUBSTRATE, AND A CAP

FIELD

The present invention relates to a micromechanical component, in particular, an inertial sensor, including a seismic mass, a substrate, and a cap; the seismic mass being deflectable in a direction perpendicular to the major plane of extension of the reference electrode; and the seismic mass including a flexible limit stop in the direction of deflection towards the substrate; the flexible limit stop of the seismic mass being connected to the main part of the seismic mass with the aid of a spring element, and the spring element being produced in an elastic layer.

BACKGROUND INFORMATION

Modern sensors for measuring linear accelerations or angular accelerations normally include a micromechanical structure, which is made up of semiconductor materials, typically, silicon or materials containing silicon, and is also called the sensor core, as well as evaluation electronics. Such sensors are used in the automotive sector, for example, in ESP systems, or also in the area of mobile devices, such as cellular phones.

Micromechanical components for measuring acceleration and rate of rotation are mass-produced for different applications in the automotive and consumer-goods sectors. Rocker-arm structures are often used for capacitive acceleration sensors having a detection direction perpendicular to the wafer plane (z-direction). The sensor principle of these rocker-arm structures is based on a spring-mass system, in which in the simplest case, a movable seismic mass forms two plate-type capacitors with two counter-electrodes fixed in position on the substrate. The seismic mass is connected to the substrate by at least one, and more likely, for reasons of symmetry, generally two torsion springs. If the mass structures on the two sides of the torsion spring are of different size, then the action of an acceleration in the z-direction will cause the mass structure to rotate relative to the torsion spring as an axis of rotation. Consequently, the spacing of the electrodes becomes smaller on the side having the larger mass and greater on the other side. The change in capacitance is a measure of an acting acceleration. These acceleration sensors are described in numerous documents, for example, in European Patent Nos. EP 0 244 581 and EP 0 773 443 B1.

An important trend in the further development of micromechanical sensors (beyond cost reduction and increase in performance) is the increase in the mechanical robustness and/or overload protection. Innovative applications yield novel installation positions and, therefore, possibly new loading profiles with increasingly stringent standards of robustness for the sensors.

At this juncture, the installation of inertial sensors in the styluses of tablets is mentioned as an example. While tablets or even smartphones are subjected to hard shocks only occasionally, it must be expected that this is very often the case with a stylus.

One possible failure mode in response to frequently repeated shock loadings is sticking, in which the movable sensor mass gets stuck on a fixed mechanical limit stop, as soon as the adhesion forces in the limit stop are greater than the restoring forces of the spring-mass system. In order to reduce the adhesion forces, a so-called anti-stiction coating (ASC) is often used, which is placed on the surface of the sensor after it is released. However, if a sensor (that is, a seismic mass or a part of it) strikes a fixed limit stop highly often, the ASC may be damaged, which means that the sensor eventually displays an increased tendency to stick. A further possible error mode due to highly frequent mechanical impact is particle formation, which results from highly fine abrasion at the surfaces of the limit stops. Such particles may possibly accumulate and restrict the freedom of movement, produce electrical short circuits, or even result, in turn, in sticking.

In the case of impact of the seismic mass on rigid structures of the sensor, high force concentrations may occur, which must be handled by the micromechanical structure. This may possibly result in mechanical damage to the structure.

To reduce the risk of sticking, nub-type limit stops are often used, for example, for z-acceleration sensors, in a conventional manner. In this case, the nubs are positioned on the lower side of the movable sensor structure. Due to the decreased impact area, the adhesion forces are relatively small, and consequently, the risk of sticking in response to occasional contact is low. However, in the case of frequent overloading, a rigid, fixed limit stop is prone to the failure mechanisms described above (sticking, particle formation). Thus, in the past, various elastic limit stops have been proposed, which, first of all, cushion the impact on the limit stop, that is, reduce the mechanical damage to the surfaces of the limit stop, and secondly, provide an increased restoring force in response to sharp overloading, since in addition to the restoring force of the functional springs of the sensor, the impact spring also contributes to the restoring force. The following documents are mentioned as related art for elastic limit stops. German Patent Application No. DE 10 2008 043 753 A1 shows a sensor having an elastic limit stop, which is produced in the same functional plane as the seismic mass. German Patent Application No. DE 10 2012 207 939 A1 describes an elastic limit stop, which is formed from a second, thin functional layer below or above a thicker functional layer. In this case, if the thin functional layer is situated beneath the thick functional layer, the impact may occur in the direction of the base electrodes. However, if the thin layer is situated above the thick functional layer, then the impact may occur in the direction of the sensor cap.

One disadvantage is that in order to produce a limit stop acting on two sides, in each instance, separate, thin functional layers would have to be provided below and above the thicker functional layer that supports the main part of the seismic mass, which requires increased expenditure and more space, as well. It is also disadvantageous to produce an elastic limit stop, using impact springs, which are produced from the thicker functional layer, since the impact springs in the thick functional layer of the microelectromechanical system (MEMS) (which typically have thicknesses greater than 10 µm, typically, 15 µm to 30 µm) must have a suitably long length. This, in turn, takes up valuable space in the sensor core.

SUMMARY

An object of the present invention is to provide an improved micromechanical component, in particular, an inertial sensor, in which the flexible limit stops have a compact construction, so that the size of the sensor core may be kept small and nevertheless, a flexible limit stop acting on two sides may be produced.

This object may be achieved by the micromechanical component, in particular, an inertial sensor, according to the present invention. Advantageous refinements of the present invention are disclosed herein.

According to a first aspect of the present invention, the micromechanical inertial sensor, that is, the micromechanical component, includes a seismic mass, a substrate, and a cap. The inertial sensor and/or component includes a reference electrode, which is in a first electrode layer and is connected to the substrate, and a further reference electrode, which is in a second electrode layer and is connected to the cap. The seismic mass is deflectable in a direction perpendicular to the major plane of extension of the reference electrode (that is, of the substrate and/or of the further reference electrode), on two sides (that is, in accordance with the two orientations regarding the direction perpendicular to the major plane of extension). According to an example embodiment of the present invention, the seismic mass has a flexible limit stop in the direction of deflection towards the first electrode layer; the flexible limit stop of the seismic mass being connected to the main part of the seismic mass with the aid of a spring element, and the spring element being produced in an elastic layer, which is positioned between, on one side, a layer of the main part of the seismic mass and, on the other side, the first electrode layer. In addition, according to an example embodiment of the present invention, the seismic mass includes a further flexible limit stop in the direction of deflection towards the second electrode layer; the further flexible limit stop of the seismic mass being connected to the spring element with the aid of a stop element situated in the layer of the main part of the seismic mass.

In this manner, the present invention may advantageously allow the same spring element to be used for producing a flexible limit stop of the seismic mass both in the direction of the substrate and also in the direction of the cap. In this manner, it is also advantageously possible that, due to the production of the spring element in a comparatively thin functional layer, which, because of this, also enables simpler production (that is, realizable with smaller dimensions) of elastic spring elements, the elastic characteristics of the spring element may be set in an optimal manner in broad ranges, without the dimensions of such a spring element becoming overly large; that is, the production of the flexible limit stop, using an elastic layer, is not limited by the comparatively high stiffness of a thicker MEMS functional layer (which makes up the main part of the seismic mass). An advantage of this is that the flexible limit stop, the further, flexible limit stop, as well as the spring element, may be constructed in a compact manner. This, in turn, conserves valuable space in the sensor core and produces, on the whole, a more compact construction of the component.

According to a preferred variant of the present invention, the layer of the main part of the seismic mass and the elastic layer take the form of functional layers; the layer thickness of the functional layer of the main part of the seismic mass being greater than the layer thickness of the elastic layer of the spring element. The use of functional layers has the advantage that the flexible limit stop and the spring element may easily be integrated by the layered construction of the seismic mass, since the individual functional layers may be patterned independently of each other. In particular, it is easily possible to integrate the flexible limit stop into different forms of the seismic mass, which means that existing sensor set-ups may be expanded by the flexible limit stop in a particularly cost-effective manner, in order to prevent "sticking."

In accordance with an example embodiment of the present invention, it is also preferable for the spring element to have the shape of an arm, which is connected to the seismic mass on one end and has, on its other end, the flexible limit stop in the direction of the first electrode layer, as well as the stop element and the further, flexible limit stop in the direction of the second electrode layer. The advantage of this shape is that it has a simple, compact geometry, which may be produced inexpensively, using conventional patterning media, and has a low space requirement. Furthermore, the flexible arm of the limit stop may be oriented in different directions within the functional layer. The movable end of the flexible arm is preferably oriented inwards (approximately in the direction of a torsion axis of the deflectable seismic mass) or outwards in the opposite direction. The option of varied orientation has the advantage that the flexible limit stop may be adapted highly effectively to the geometry of conventional components.

According to a preferred further refinement of the present invention, the flexible limit stop produces or has a projection, which may also be referred to as a nub; the projection being provided on the elastic layer so as to protrude chiefly in the deflection direction. This variant allows the contact area to be kept small in the state of impact. This reduces the risk of "sticking" of the seismic mass. In addition, it is advantageous that by depositing the projection, a special material having effective anti-adhesion properties may be selected, which means that the risk of "sticking" is decreased further.

According to a preferred further refinement of the present invention, a rigid limit stop is also situated in the plane of the first electrode layer, adjacent to the flexible limit stop, and a further, rigid limit stop is situated in the plane of the second electrode layer, adjacent to the further, flexible limit stop; in response to at least local deflection of the seismic mass in the direction of the plane of the first electrode layer, the deflection of the flexible limit stop and of the seismic mass being limited by the rigid limit stop; and in response to at least local deflection of the seismic mass in the direction of the plane of the second electrode layer, the deflection of the further, flexible limit stop and of the seismic mass being limited by the further, rigid limit stop. The advantage of this specific embodiment is that due to the presence of the rigid limit stop and/or the further, rigid limit stop, the flexible limit stop and/or the further, flexible limit stop and, consequently, the seismic mass, are deflected, as a whole, only up to a certain point. This prevents possible overloading and functional impairment of the seismic mass. Nevertheless, the restoring force of the flexible limit stop produced by the limited deflection reduces the risk of "sticking" of the seismic mass.

According to a preferred further refinement of the present invention, the rigid limit stop and the further, rigid limit stop have the same electrical potential as the seismic mass. A particular advantage of this specific embodiment is that the limit stop of the movable sensor structure and/or of the seismic mass is potential-free at the rigid limit stops (that is, at the rigid limit stop and/or the further, rigid limit stop), which considerably reduces the risk of electrical short circuits between the movable sensor structure and fixed electrodes, and therefore, the risk of malfunction of the sensor.

According to a preferred further refinement of the present invention, the seismic mass takes the form of a rocker-arm structure, which has a first and a second cantilever, is deflectable about a torsion axis with respect to the substrate, and is connected to the substrate via a spring element; the two cantilevers of the rocker arm having different masses. At least one flexible limit stop may optionally be formed on each of the two cantilevers of the rocker arm. This advantageously reduces the probability of "sticking" of the rocker arm and, therefore, of the seismic mass, in the two deflection directions.

Exemplary embodiments of the present invention are represented in the figures and explained in more detail in the following description of the figures.

DETAILED DESCRIPTION OF EXAMPLE EMBODIMENTS

Figure 1:
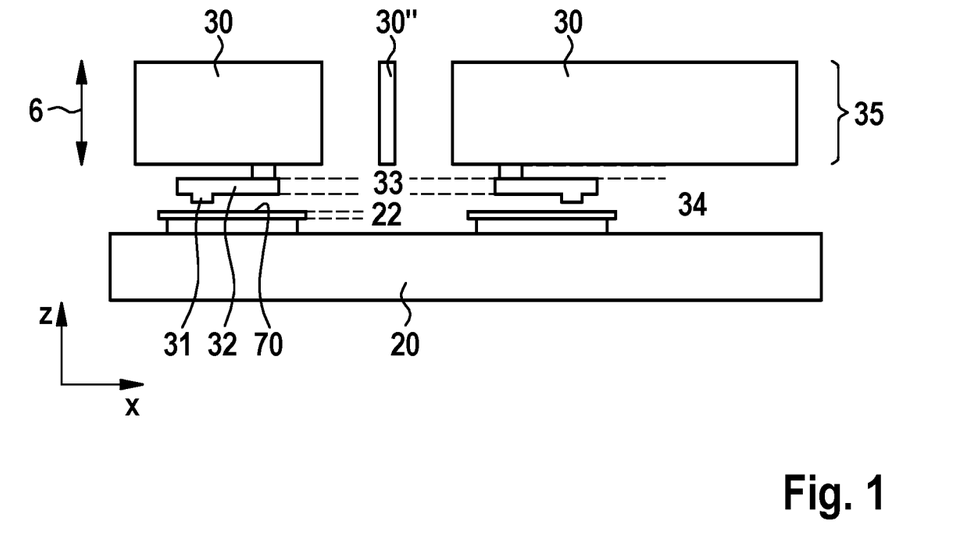
FIG. 1 shows a schematic sectional view of a micromechanical inertial sensor and/or a micromechanical component according to the related art, including a spring element between the main part of the seismic mass and the substrate.

A set-up of a micromechanical inertial sensor and/or component having a seismic mass 30 and a substrate 20 is represented in FIG. 1; the inertial sensor and/or the component including a reference electrode 70, which is in a first electrode layer 22 and is connected to substrate 20; seismic mass 30 being deflectable on two sides, in a direction 6 perpendicular to the major plane of extension of reference electrode 70 (that is, perpendicular to the major direction of extension of substrate 20) (that is, deflectable in both the positive z-direction and negative z-direction). Seismic mass 30 has a flexible limit stop 31 in the direction of first electrode layer 22; flexible limit stop 31 of seismic mass 30 being connected to the main part of seismic mass 30 with the aid of a spring element 32; spring element 32 being produced in an elastic layer 33, which is positioned between, on one side, a layer 35 of the main part of seismic mass 30 and, on the other side, first electrode layer 22. This set-up functions effectively, if the sensor cap is markedly further way from the upper side of the movable sensor structure and/or of seismic mass 30 than the base electrodes (that is, reference electrode 70 and/or first electrode layer 22) are from elastic and/or flexible limit stop 31 underneath the sensor structure (and/or seismic mass); that is, if the limit-stop gap in the direction of the base electrodes (first electrode layer 22) is less than the cap distance.

Figure 2:
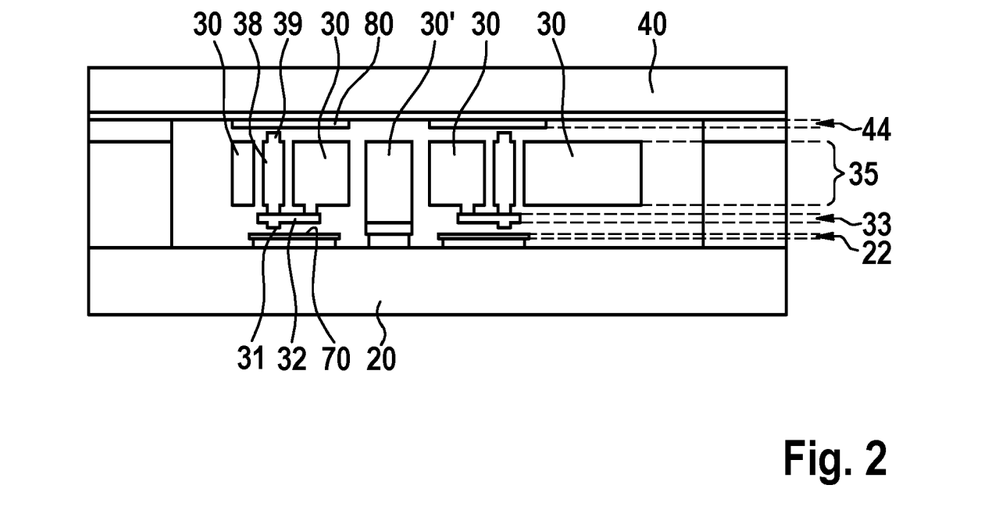
FIG. 2 and FIG. 3 show, in each instance, a schematic sectional view of a micromechanical inertial sensor and/or component of the present invention, according to different variants.
Figure 3:
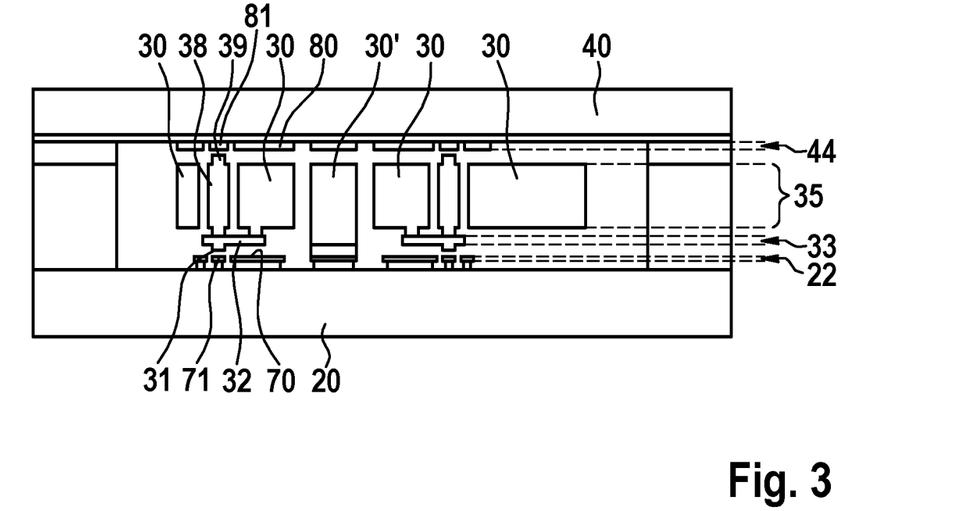

Schematic sectional views of a micromechanical inertial sensor and/or component of the present invention, according to different variants, are shown in each of FIGS. 2 and 3. These representations show the sensor construction according to the view of FIG. 1, but with a cap 40 (that is, sensor cap), which is situated at a short distance from the upper side of seismic mass 30 similar to the impact gap on the lower side (that is, in the direction of first electrode layer 22). Thus, it is also possible for the seismic mass to strike cap 40, which, however, is supposed to be prevented by the present invention. According to the two representations of the present invention in FIGS. 2 and 3, the micromechanical inertial sensor and/or component including seismic mass 30 and substrate 20 has a cap 40, which is connected in a conventional manner to substrate 20 and/or to layers deposited over it, in order to produce a cavity. The inertial sensor and/or component includes, in turn, reference electrode 70, which is in first electrode layer 22 and is connected to substrate 20. According to the present invention, the inertial sensor and/or component also includes a further reference electrode 80, which is in a second electrode layer 44 and is connected to the cap; seismic mass 30 being deflectable on two sides, in a direction perpendicular to the major plane of extension of reference electrode 70 (that is, perpendicular to the major direction of extension of further reference electrode 80 and/or to the major direction of extension of substrate 20); and seismic mass 30 including, in turn, flexible limit stop 31 in the direction of deflection towards first electrode layer 22; flexible limit stop 31 of seismic mass 30 being connected to the main part of seismic mass 30 with the aid of spring element 32.

The spring element is produced, in turn, in an elastic layer 33, which is positioned between, on one side, layer 35 of the main part of seismic mass 30 and, on the other side, first electrode layer 22. Seismic mass 30 now includes a further flexible limit stop 39 in the direction of deflection towards second electrode layer 44; further flexible limit stop 39 of seismic mass 30 being connected to spring element 32 with the aid of a stop element 38 situated in layer 35 of the main part of seismic mass 30. An anchor point of the sensor structure and/or seismic mass 30 to substrate 20 is indicated by reference numeral 30'. As an option, an upper nub may be situated on the upper side of the stop element (that is, in layer 35 of the main part of seismic mass 30), that is, further flexible limit stop 39 may take the form of a nub, in order to be able to keep the impact area in the direction of the cap side very small, as well.

Spring element 32 in elastic layer 33 now acts as a spring element not only for the impact in the direction of the base electrodes in first electrode layer 22, but also for the impact between layer 35 of the main part of seismic mass 30 and cap 40, which includes, in this case, a wiring plane (that is, second electrode layer 44). Thus, as shown in FIG. 2, a highly compact, two-sided, flexible limit stop is produced.

The impact of the movable sensor structure with the fixed limit stops is advantageously potential-free, since short circuits between the movable sensor structure and the fixed electrodes and, consequently, malfunctions of the sensor, may otherwise be produced. Thus, the set-up of FIG. 2 is to be viewed as highly simplified, in order to show the basic principle of the present invention.

FIG. 3 shows a set-up of the present invention that is improved with regard to freedom from potential. The basic set-up is the same as in FIG. 2, but in this case, the fixed impact surfaces above (formed in second electrode layer 44) and below (formed in first electrode layer 22) the sensor structure are put at a separate electrical potential, which typically matches the electrical potential of the movable sensor structure (that is, seismic mass 30). This prevents electrical short circuits during impact and minimizes the electrostatic forces of attraction between the contact surfaces of the fixed and movable limit stops and consequently minimizes the risk of sticking. Thus, in contrast to the representation of FIG. 2, in the variant shown in FIG. 3, a rigid limit stop 71 is situated in the plane of first electrode layer 22, adjacent to flexible limit stop 31, and a further, rigid limit stop 81 is situated in the plane of second electrode layer 44, adjacent to further, flexible limit stop 39. In the case of (at least local) deflection of seismic mass 30 in the direction of the plane of first electrode layer 22 (that is, downwards in accordance with the representation), this allows the deflection of flexible limit stop 31 and of seismic mass 30 to be limited by rigid limit stop 71. In addition, in response to (at least local) deflection of seismic mass 30 in the direction of the plane of second electrode layer 44 (that is, upwards according to the representation), the deflection of further, flexible limit stop 39 and of seismic mass 30 are limited by further, rigid limit stop 81. Therefore, the present invention allows the spring action of spring element 32 to be used not only in the direction of the base electrodes (that is, first electrode layer 22), but also in the direction of the cap (that is, second electrode layer 44); thus, it allows a flexible z-limit stop simultaneously active in the two out-of-plane directions to be implemented. It is particularly advantageous that this may be accomplished in a particularly compact manner, since by utilizing the relatively low layer thickness of flexible and/or elastic layer 33, comparatively soft spring elements may already be produced by relatively short bending beams, and consequently, particularly compact, elastic limit stops may be produced.

Figure 4:
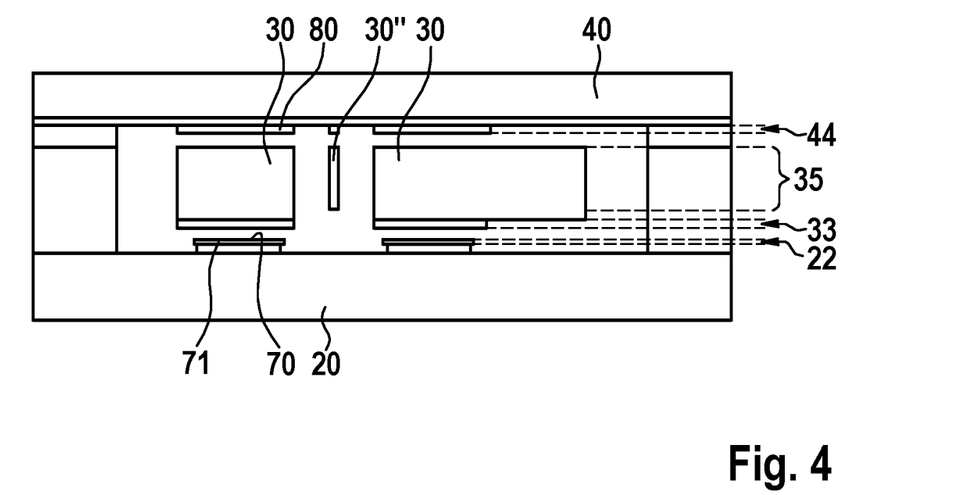
FIG. 4 shows a further schematic sectional view of a micromechanical inertial sensor and/or component of an example embodiment of the present invention.
Figure 5:
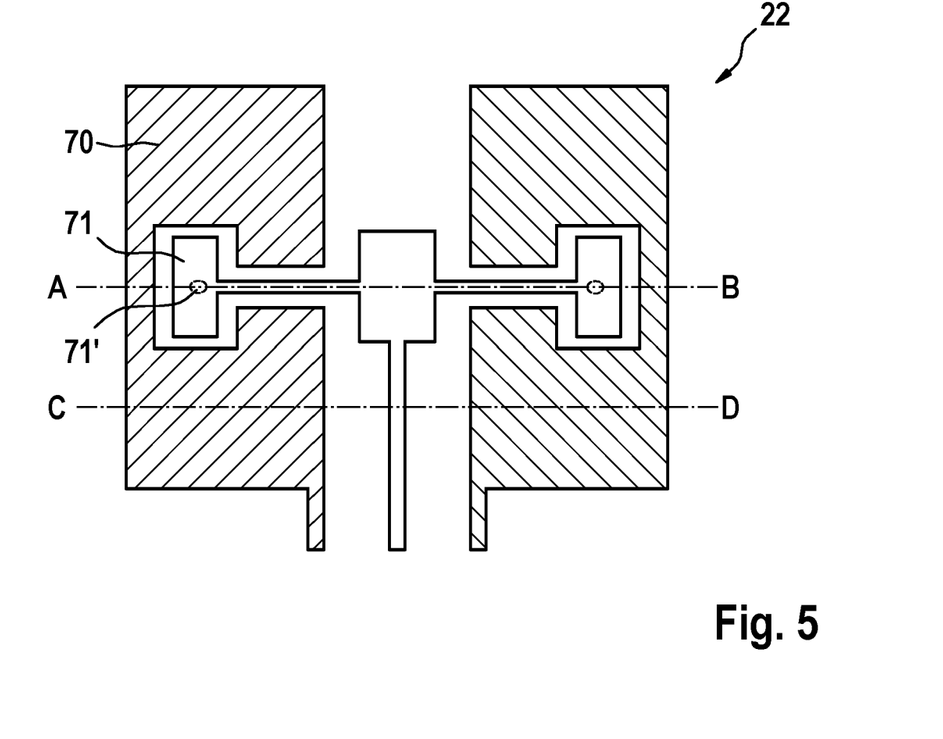
FIG. 5, FIG. 6, FIG. 7, and FIG. 8 show, in each instance, schematic top views of different planes and/or layers in the structure of the micromechanical inertial sensor and/or component of example embodiments of the present invention.
Figure 6:
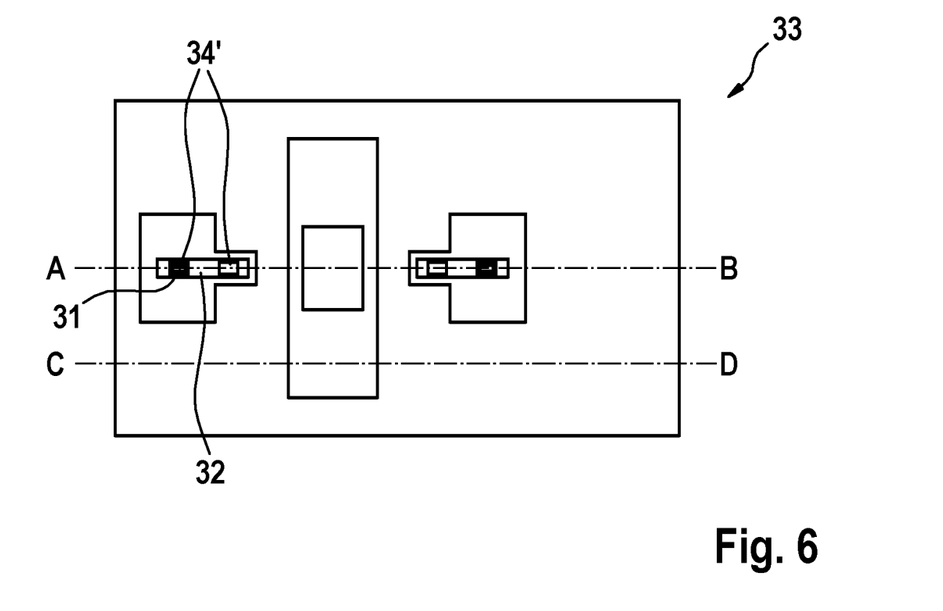
Figure 7:
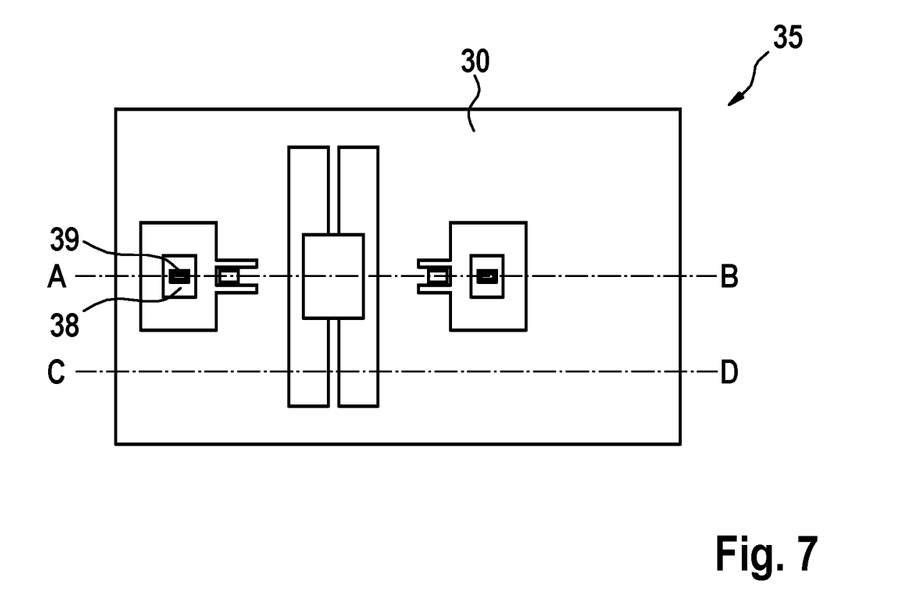
Figure 8:
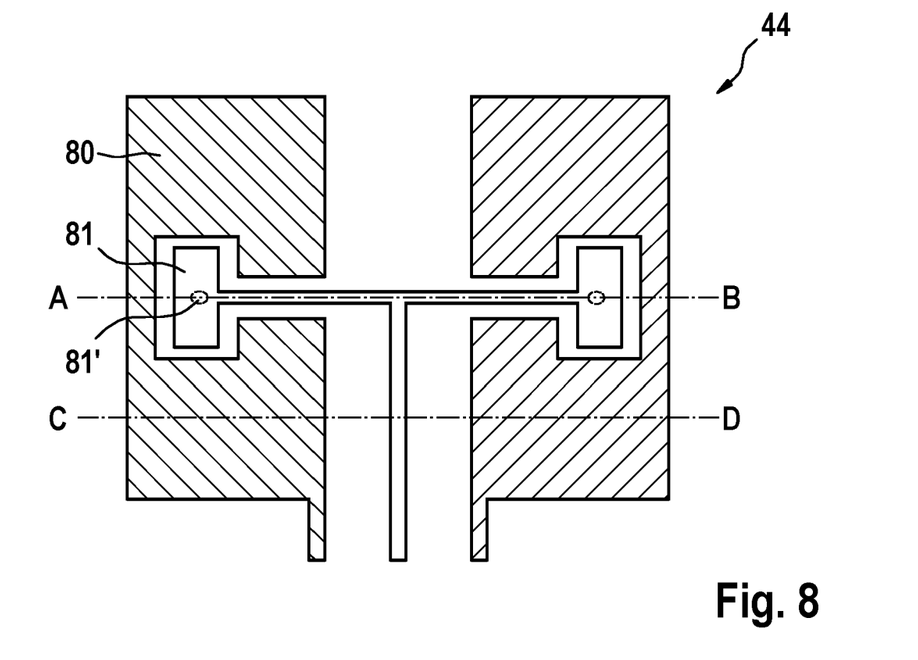

In each instance, a sectional view of the sensor structure is represented in the two FIGS. 2 and 3, in which the cut is made through central anchor point 30' of the sensor structure (that is, of seismic mass 30) and through the elastic limit stops. However, in an actual sensor structure, the elastic limit stops take up only a comparatively small portion of the sensor area. In order to illustrate this, FIG. 4 shows a further cross section along a different sectional plane, in which there are no limit-stop structures. FIGS. 5 through 8 each show schematic top views of different planes and/or layers in the structure of the micromechanical inertial sensor and/or component of the present invention; in each instance, a sectional plane A-B and a sectional plane C-D being indicated; the sectional views shown in FIGS. 2 and 3 correspond to sectional plane A-B in FIGS. through 8, and the sectional view shown in FIG. 4 corresponds to sectional plane C-D in FIGS. 5 through 8. In this connection, FIG. 5 shows the plane of base electrodes 70 (that is, of first electrode layer 22) and rigid limit stop 71 (and/or fixed limit stops). A region, which indicates impact positions 71' of the nub stops of flexible limit stop 31 (on the lower side of elastic layer 33), is marked in the center of rigid limit stop 71. The structure of elastic layer 33, in which spring element 32 is produced, is shown in FIG. 6: In addition to the designated sensor nubs of flexible limit stop 31 on the lower side of flexible layer 33, vias 34' between flexible layer 33 and layer 35 of the main part of seismic mass 30 in the region of the elastic bending beam are also shown. For the sake of simplicity, further vias between these layers in the region of seismic mass 30 are not shown. In addition, perforation holes, which are normally needed in the movable structure in order to be able to remove sacrificial oxides underneath the movable structure in a time-efficient manner, are not drawn at all. FIG. 7 shows the structure of layer 35 of the main part of seismic mass 30, in particular, stop element 38, as well, in the direction of the cap side, including the impact nub of the further flexible limit stop 39 optionally situated on it. FIG. 8 shows a possible set-up of evaluation electrodes (that is, further reference electrodes 80) in second electrode layer 44, as well as fixed limit stops (that is, further, rigid limit stops 81) on the cap side. The set-up strongly resembles the set-up in first electrode layer 22 shown in FIG. 5, though the set-up of the useful electrode surfaces is a mirror image of that of FIG. 5, in order to detect rotary deflections of the sensor structure. In FIGS. 5 and 8, this is made clear, using different hatching of the various electrodes within the respective electrode layers 22, 44.

Figure 9A:
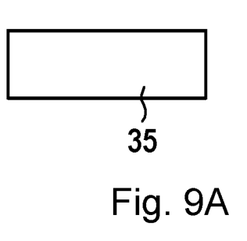
FIGS. 9A-9C and FIGS. 10A-10D show schematic representations for producing the layer of the main part of the seismic mass, in accordance with an example embodiment of the present invention.
Figure 9B:
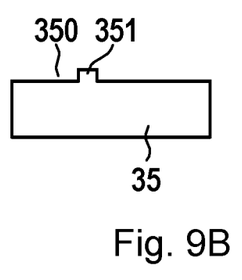
Figure 9C:
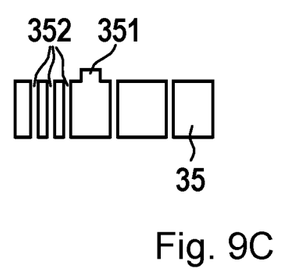
Figure 10A:
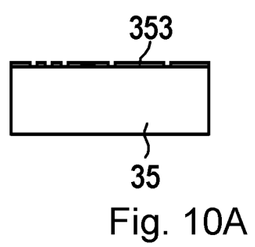
Figure 10B:
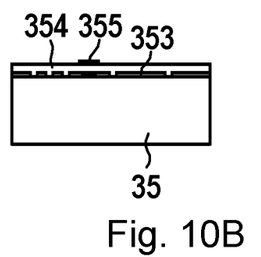
Figure 10C:
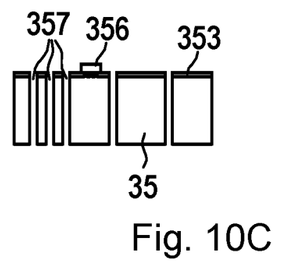
Figure 10D:
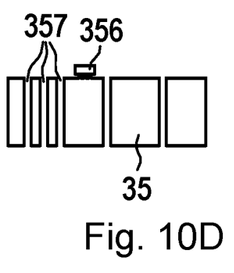

FIGS. 9A-9C and 10A-10D show schematic views for producing layer 35 of the main part of seismic mass 30, in particular, a possible method of producing the upper nub (that is, the impact nub optionally situated on further, flexible limit stop 39, on stop element 38) towards the cap side, that is, for impact in the direction of the cap. In each instance, layer 35 of the main part of seismic mass 30 is illustrated. FIGS. 9A-9C show how the region of the nub 351 to be produced is masked by a first mask and the remainder 350 of layer 35 is etched back over time (FIG. 9B). Since it is generally sufficient to produce nub heights of a few 100 nm, and the typical thickness of layer 35 of the main part of seismic mass 30 is in the range of 10-30 μm, this process may be defined adequately well in spite of the timing. In FIG. 9C, it is shown how the actual functional trench 352 for layer 35 is produced with the aid of a second mask. FIGS. 10A-10D show an alternative production method, which utilizes a buried hard mask (that is, a patterned oxide layer as a mask) and requires, in comparison with the method of FIG. 9A-9C, two additional depositions of layers, but makes do with the same number of masks. In FIG. 10A, a thin oxide layer 353 is deposited onto layer 35 and patterned with the aid of a first mask. As shown in FIG. 10B, a poly-Si (polysilicon) layer 354 is then deposited (and, as an option, subsequent smoothed, using CMP (chemical mechanical polishing)), and the region of nub 356 is defined, using a resist mask 355. As shown in FIG. 10C, functional trench 357 is subsequently produced, which both etches the poly-Si layer above oxide layer 353 and patterns the underlying part of layer 35, using the oxide mask. In FIG. 10D, resist mask 355 and oxide layer 353 are then removed.

Although the exemplary embodiments are explained primarily in view of z-acceleration sensors, the micromechanical inertial sensor and/or component of the present invention relates to other MEMS components, as well, such as yaw-rate sensors, micromirrors, or resonators.

What is claimed is:

1. A micromechanical component, comprising:
   a seismic mass;
   a substrate;
   a cap;
   a reference electrode, which is in a first electrode layer and is connected to the substrate; and
   a further reference electrode, which is in a second electrode layer and is connected to the cap;
   wherein the seismic mass is deflectable on two sides, in a direction perpendicular to a major plane of extension of the reference electrode, and the seismic mass includes a flexible limit stop in a direction of deflection towards the first electrode layer, the flexible limit stop of the seismic mass being connected to a main part of the seismic mass using a spring element, the spring element being produced in an elastic layer, which is positioned between a layer of the main part of the seismic mass and the first electrode layer, and wherein the seismic mass includes a further flexible limit stop in a direction of deflection towards the second electrode layer, the further flexible limit stop of the seismic mass being connected to the spring element using a stop element situated in the layer of the main part of the seismic mass.

2. The micromechanical component as recited in claim 1, wherein the micromechanical component is an inertial sensor.

3. The micromechanical component as recited in claim 1, wherein the layer of the main part of the seismic mass and the elastic layer are functional layers, and a layer thickness of the functional layer of the main part of the seismic mass is greater than a layer thickness of the elastic layer of the spring element.

4. The micromechanical component as recited in claim 1, wherein the spring element has a shape of an arm, which is connected to the seismic mass on one end and has, on its other end, the flexible limit stop in the direction of the first electrode layer, and the limit stop element and the further flexible limit stop in the direction of the second electrode layer.

5. The micromechanical component as recited in claim 1, wherein a rigid limit stop is situated in a plane of the first electrode layer, adjacent to the flexible limit stop, and a further rigid limit stop is situated in a plane of the second electrode layer, adjacent to the further flexible limit stop, and wherein, in response to at least local deflection of the seismic mass in a direction of the plane of the first electrode layer, a deflection of the flexible limit stop and of the seismic mass is limited by the rigid limit stop, and in response to at least local deflection of the seismic mass in a direction of the plane of the second electrode layer, the deflection of the further flexible limit stop and of the seismic mass is limited by the further rigid limit stop.

6. The micromechanical component as recited in claim 1, wherein the rigid limit stop and the further rigid limit stop have the same electrical potential as the seismic mass.

7. The micromechanical component as recited in claim 1, wherein the seismic mass takes the form of a rocker-arm structure having a first and a second cantilever; the rocker-arm structure is deflectable about a torsion axis with respect to the substrate, and the two cantilevers of the rocker arm have different masses.

8. The micromechanical component as recited in claim 1, wherein, to produce a nub situated on the further flexible limit stop: (i) the layer of the main part of the seismic mass is etched over time, or (ii) the nub is generated, using a buried, patterned oxide layer as a mask.

* * * * *